United States Patent
Li

(10) Patent No.: US 11,783,616 B2
(45) Date of Patent: Oct. 10, 2023

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuanhang Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/980,010

(22) PCT Filed: Apr. 1, 2020

(86) PCT No.: PCT/CN2020/082662
§ 371 (c)(1),
(2) Date: Sep. 11, 2020

(87) PCT Pub. No.: WO2021/139010
PCT Pub. Date: Jul. 15, 2021

(65) Prior Publication Data
US 2023/0096025 A1    Mar. 30, 2023

(30) Foreign Application Priority Data
Jan. 7, 2020   (CN) .......................... 202010013828.6

(51) Int. Cl.
*G06V 40/13* (2022.01)
*G06V 40/12* (2022.01)
(Continued)

(52) U.S. Cl.
CPC ...... *G06V 40/1318* (2022.01); *G06V 40/1329* (2022.01); *G06V 40/1365* (2022.01); *H01L 27/14623* (2013.01); *H10K 59/40* (2023.02); *H10K 59/65* (2023.02); *G06V 40/1324* (2022.01)

(58) Field of Classification Search
None
See application file for complete search history.

(56) References Cited

U.S. PATENT DOCUMENTS 11,508,176 B2 * 11/2022 Sun .................. H10K 59/126
2018/0276444 A1    9/2018 Sun et al.
(Continued)

FOREIGN PATENT DOCUMENTS

CN    106847872 A    6/2017
CN    107977632 A    5/2018
(Continued)

*Primary Examiner* — Joseph R Haley

(57) ABSTRACT

The present invention provides a display device. The display device includes a display region, a fingerprint recognition region disposed in the display region, and further includes a display panel. The display panel includes a light-shielding structure. A plurality of light-transmitting holes is disposed in the light-shielding structure in the fingerprint recognition region. A fingerprint recognition group is disposed under the display panel and corresponds to the fingerprint recognition region.

12 Claims, 2 Drawing Sheets

(51) Int. Cl.
    *H10K 59/40*     (2023.01)
    *H10K 59/65*     (2023.01)
    *H01L 27/146*     (2006.01)

(56) References Cited

U.S. PATENT DOCUMENTS

| | | |
|---|---|---|
| 2019/0172886 A1 | 6/2019 | Ma et al. |
| 2019/0172887 A1 | 6/2019 | Sun et al. |
| 2019/0197286 A1 | 6/2019 | Kim et al. |
| 2019/0206963 A1 | 7/2019 | Zhang et al. |
| 2019/0220649 A1* | 7/2019 | Zhu .................. H10K 59/65 |
| 2020/0075704 A1* | 3/2020 | Liu .................. H10K 71/00 |
| 2020/0343311 A1* | 10/2020 | Li .................. H10K 59/40 |
| 2020/0348550 A1 | 11/2020 | Vanduyne |

FOREIGN PATENT DOCUMENTS

| | | |
|---|---|---|
| CN | 107978624 A | 5/2018 |
| CN | 108231840 A | 6/2018 |
| CN | 109273497 A | 1/2019 |
| CN | 110309705 A | 10/2019 |

* cited by examiner

DISPLAY DEVICE

FIELD OF INVENTION

The present disclosure relates to the field of display technology, and more particularly, to a display device.

BACKGROUND OF INVENTION

With display terminal equipment, such as tablets, enter a generation of full screens, fingerprint recognition region on a front of the display terminal equipment is squeezed by the full screens, so that under-display (under-screen) fingerprint recognition technology has attracted more and more attention. The under-display fingerprint recognition technology refers to installing a fingerprint recognition module (such as a fingerprint recognition module) under a display screen, thereby achieving fingerprint recognition operations in a display region of the display screen without disposing a fingerprint collection region on a front of electronic devices except the display region.

Optical under-display fingerprint recognition technology uses light refracted from a top surface of a display component of the equipment to perform fingerprint sensing and other sensing operations. The returned light carries information of objects (such as fingers) in contact with the top surface, and by collecting and detecting the returned light, a specific optical sensor module located below the display screen is achieved. A design of the optical sensor module can be to achieve a desired optical imaging by appropriately configuring optical elements for collecting and detecting the returned light. For organic light-emitting diode (OLED) screens, a light source for the under-display fingerprint recognition comes from an OLED self-luminous layer. However, the light emitted by the screen interferes with fingerprint imaging of the optical fingerprint recognition modules to a certain extent, so that fingerprint collection efficiency is reduced.

SUMMARY OF INVENTION

In order to solve the above technical problems, the present disclosure provides a display device to solve the technical problem that a fingerprint recognition module in the prior art is prone to touch failure or inaccuracy caused by non-touch control light.

The technical solution for solving the above technical problem is that the present disclosure provides a display device. The display device comprises a display region and a fingerprint recognition region disposed in the display region. The display device further comprises a display panel, the display panel comprises a light-shielding structure, and a plurality of light-transmitting holes is disposed in the light-shielding structure in the fingerprint recognition region. A fingerprint recognition group is disposed under the display panel and corresponds the fingerprint recognition region.

Furthermore, the light-shielding structure comprises a planarization layer disposed on an entirety of the display region. A pixel definition layer is disposed on the entirety of the display region and covering the planarization layer, and the planarization layer and the pixel definition layer are made of light-shielding materials. A plurality of first through-holes pass through an entirety of the planarization layer and the pixel definition layer. A light-shielding layer is disposed on the entirety of the display region. A plurality of second through-holes pass through the light-shielding layer and corresponding to the first through-holes.

Furthermore, the planarization layer and the pixel definition layer are made of black polyimide materials.

Furthermore, the light-shielding layer is made of a black polyimide material or a metal material.

Furthermore, the light-shielding structure further comprises a plurality of retaining wall structures disposed on the pixel definition layer. A portion of the retaining wall structures are located in the fingerprint recognition region. The light-shielding structure further comprises a plurality of third through-holes penetrating through an entirety of the retaining wall structures. Each of the third through-holes disposed corresponds to one first through-hole.

Furthermore, the display panel comprises a substrate, a blocking layer disposed on the substrate, a buffer layer disposed on the blocking layer, a thin film transistor structure layer disposed on the buffer layer, wherein the planarization layer is disposed on the thin film transistor structure, an anode layer disposed on the planarization layer and partially penetrating through the planarization layer is connected to the thin film transistor structure layer, wherein the pixel definition layer is disposed on the planarization layer and covers the anode layer, and a pixel opening is defined on the pixel definition layer corresponding to the anode layer, a light-emitting layer disposed in the pixel opening, wherein a retaining wall opening is defined on the retaining wall structures corresponding to the pixel opening, a cathode layer disposed on the light-emitting layer and disposed in the retaining wall opening, and a package layer disposed on the pixel definition layer.

Furthermore, the display device further comprises a touch control layer disposed on a side of the package layer away from the pixel definition layer.

Furthermore, the fingerprint recognition group comprises an optical lens disposed under the fingerprint recognition region of the display panel, and a light sensor disposed on a side of the optical lens away from the display panel.

Furthermore, projections of the first through-hole and the second through-hole on a substrate are at least one of a circle, a rhombus, or a rectangle.

Furthermore, an entirety of a projection of the first through-hole on the substrate falls into a projection of the second through-hole on the substrate.

Beneficial effects of the present disclosure are that materials of the planarization layer, the pixel definition layer, and the retaining wall structure of the present disclosure are changed from light-transmitting materials in the prior art to opaque materials, and a light-transmitting hole is defined in the fingerprint recognition region, to prevent accuracy of the fingerprint recognition module from affecting by non-touch effective light, thereby improving accuracy of fingerprint recognition and touch control. Meanwhile, a design of the light-transmitting hole plays a role of collimator, so that the collimator device in the fingerprint recognition module can be removed, and a thickness of the display device is reduced.

DESCRIPTION OF DRAWINGS

The following describes specific implementation of the present disclosure in detail with reference to drawings, which will make the technical solutions and other beneficial effects of the present disclosure obvious.

Figure 1:
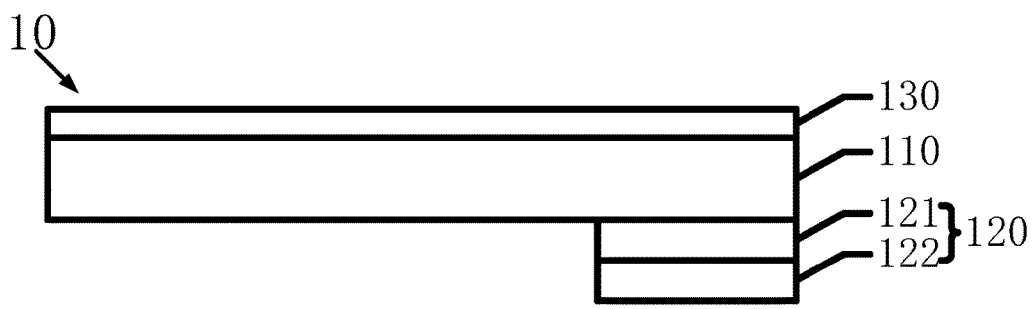
FIG. 1 is a schematic diagram of a display device in an embodiment.

Figure numerals: display device 10, display panel 110, fingerprint recognition group 120, touch control layer 130, display region 101, fingerprint recognition region 102, substrate 111, blocking layer 112, buffer layer 113, thin film transistor structure layer 114, active layer 1141, first insulation layer 1142, first gate layer 1143, second insulation layer 1144, second gate layer 1145, third insulation layer 1146, source/drain 1147, light-shielding structure 115, anode layer 116, light-emitting layer 117, cathode layer 118, package layer 119, planarization layer 1151, pixel definition layer 1152, retaining wall structure 1153, pixel opening 11521, pixel region 1011, light-shielding region 1012, first through-hole 11501, light-shielding layer 1105, and second through-hole 11502.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In the present disclosure, unless explicitly stated and defined otherwise, the first feature may be "above" or "below" the second feature and may include direct contact between the first and second features. It may also include that the first and second features are not in direct contact but are contacted by another feature between them. Moreover, the first feature is "above" the second feature, including the first feature directly above and obliquely above the second feature, or merely indicates that the first feature is higher in level than the second feature. The first feature is "below" the second feature, including the first feature is directly below and obliquely below the second feature, or only indicates that the first feature is less horizontal than the second feature.

The following disclosure provides many different embodiments or examples for achieving different structures of the present disclosure. To simplify the present disclosure, components and settings of specific examples are described below. They are only examples and are not intended to limit the present disclosure. In addition, the present disclosure may repeat reference numbers and/or reference letters in different examples, this repetition is for the purpose of simplicity and clarity, and does not itself indicate the relationship between various embodiments and/or settings discussed. In addition, the present disclosure provides examples of various specific processes and materials, but those of ordinary skill in the art may be aware of the present disclosure of other processes and/or the use of other materials.

Embodiment 1

In the present embodiment, a display device 10 of the present disclosure comprises a display region 101 and a fingerprint recognition region 102 disposed in the display region 101.

The display region 101 further comprises a plurality of pixel regions 1011 and a light-shielding region 1012, the pixel regions 1011 are evenly distributed in the display region 101, and the light-shielding region 1012 surrounds the pixel regions 1011.

As shown in FIG. 1, the display device 10 further comprises a display panel 110, a fingerprint recognition group 120, and a touch control layer 130.

Figure 2:
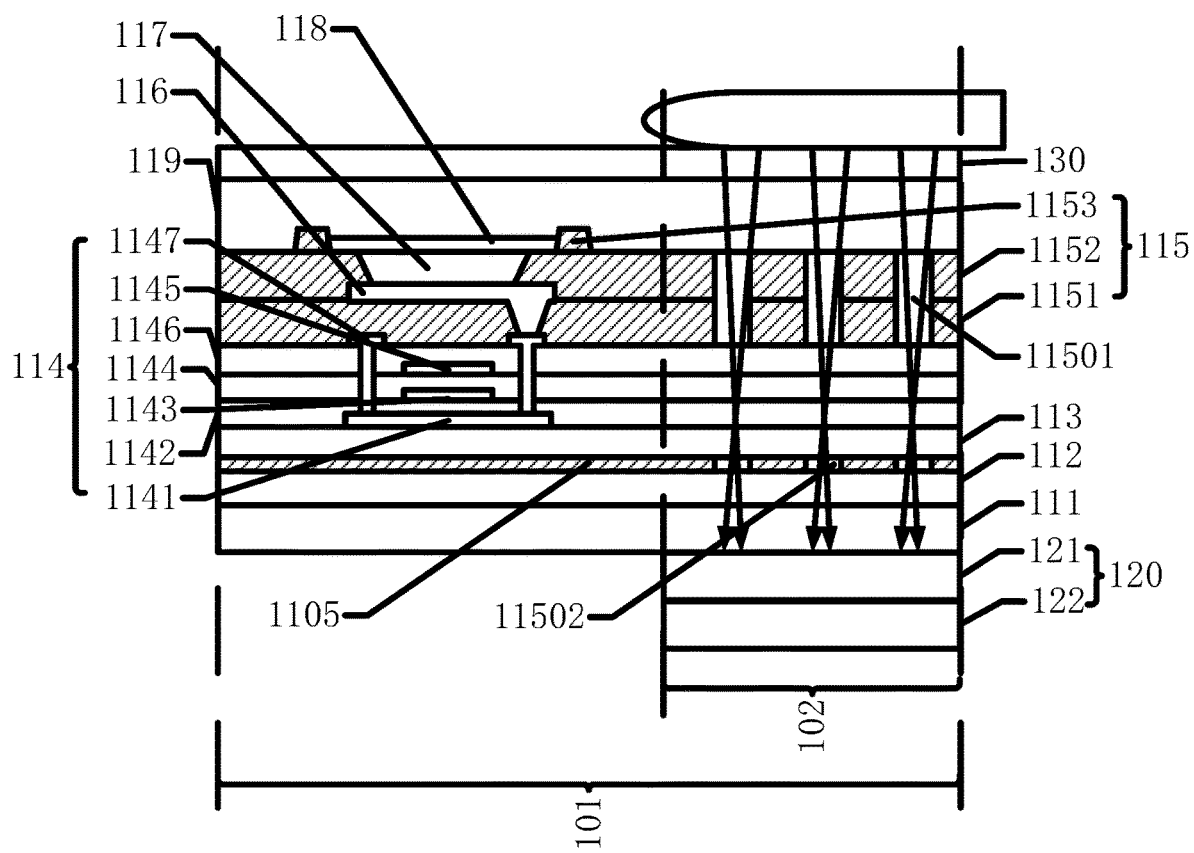
FIG. 2 is a side view of the display device in the embodiment.

As shown in FIG. 2, the display panel 110 comprises a substrate 111, a blocking layer 112, a buffer layer 113, a thin film transistor structure layer 114, a light-shielding structure 115, an anode layer 116, a light-emitting layer 117, a cathode layer 118, and a package layer 119.

The blocking layer 112 is disposed on the substrate 111 and used to block outside water vapor from invading into the display panel 110.

The buffer layer 113 is disposed on the blocking layer 112, and the thin film transistor structure layer 114 is disposed on the buffer layer 113.

Specifically, the thin film transistor structure layer 114 comprises an active layer 1141, a first insulation layer 1142, a first gate layer 1143, a second insulation layer 1144, a second gate layer 1145, a third insulation layer 1146, and a source/drain 1147.

The active layer 1141 is disposed on the buffer layer 113, the first insulation layer 1142 is disposed on the buffer layer 113 and covers the active layer 1141, the first gate layer 1143 is disposed on the first insulation layer 1142, the second insulation layer 1144 is disposed on the first insulation 1142 and covers the first gate layer 1143, the second gate layer 1145 is disposed on the second insulation layer 1144, the third insulation 1146 is disposed on the second insulation layer 1144 and covers the second gate layer 1145, and the source/drain 1147 is disposed on the third insulation layer 1146, wherein the source/drain 1147 passes through the third insulation layer 1146, the second insulation layer 1144, and the first insulation layer 1142 to be connected to the active layer 1141.

The first insulation layer 1142, the second insulation layer 1144, and the third insulation layer 1147 extend to an entirety of the display region 101, and first insulation 1142, the second insulation layer 1144, and the third insulation layer 1146 are made of light-transmitting materials, so that the display panel 110 can display images normally.

The light-shielding structure 115 comprise a planarization layer 1151, a pixel definition layer 1152, and a retaining wall structure 1153.

The planarization layer 1151 is disposed on the thin film transistor structure layer 114 and extends into the fingerprint recognition region 102.

The anode layer 116 is disposed on the planarization layer 1151 and corresponds to the thin film transistor structure layer 114, the anode 116 further comprises a pin, and the pin passes through the planarization layer 1151 to be connected to the thin film transistor structure layer 114.

The pixel definition layer 1152 is disposed on the planarization layer 1151 and covers the anode layer 116, the pixel definition layer 1152 corresponds a position of the anode layer 116 with a pixel opening 11521, the pixel opening 11521 is correspondingly disposed in the pixel region 1011, and the anode layer 116 is partially or entirely exposed in the pixel opening 11521.

The light-emitting layer 117 is disposed in the pixel opening 11521. Since the anode layer 116 is partially or entirely exposed in the pixel opening 11521, the light-emitting layer 117 is in contact with the anode layer 116 in the pixel opening 11521.

The retaining wall structure 1153 is disposed on the pixel definition layer 1152. Specifically, the retaining wall structure 1153 is disposed around the pixel opening 11521 on the pixel definition layer 1152, that is, a retaining wall opening is enclosed above the pixel opening 11521. Since the light-emitting layer 117 is exposed in the retaining wall opening, the cathode layer 118 is disposed in the retaining wall opening, and the cathode layer 118 is in contact with the light-emitting layer 117.

The light-shielding structure 115 is made of a black polyimide materials or metal material, which has a good shielding effect. The light-shielding structure 1153 can effectively block ineffective light in the fingerprint recognition region 102, which greatly improves accuracy of fingerprint recognition. Meanwhile, in order to ensure that light refracted by a fingerprint touch control passes through the fingerprint recognition region 102, a plurality of first through-holes 11501 are defined on the light-shielding structure 115. A projection of the first through-hole 11501 on a substrate is at least one of a circle, a rhombus, or a rectangle. In the present embodiment, the projection of the first through-hole 11501 on the substrate 111 is circular.

The first through-hole 11501 passes through the planarization layer 1151 and the pixel definition layer 1152. When the retaining wall structure 1153 is also within a range of the first through-hole 11501, the first through-hole 11501 also passes through the retaining wall structure 1153.

The display panel 110 further comprises a light-shielding layer 1105, the light-shielding layer 1105 is disposed between the blocking layer 112 and the buffer layer 113, and a second through-hole 11502 is defined at a position of the light-shielding layer 1105 corresponding to the first through-hole 11501. A shape and a size of the second through-hole 11502 are equal to a shape and a size of the first through-hole 11501, and the light-shielding layer 1105 is used to further restrict ineffective light from entering the fingerprint recognition group 120.

The touch control layer 130 is disposed on a side of the display panel 110 away from the fingerprint recognition group 120, a plurality of touch control components are disposed on the touch control layer 130 and are for users to perform touch control operation on the display device 10.

Figure 3:
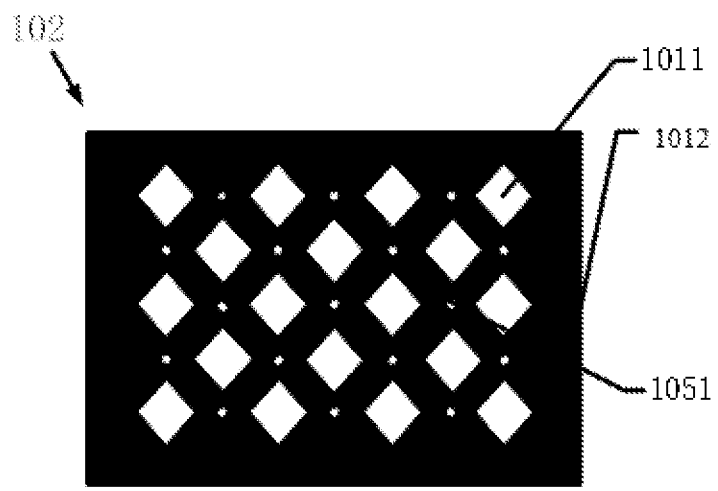
FIG. 3 is a schematic diagram of a fingerprint recognition region in the embodiment.
Figure 4:
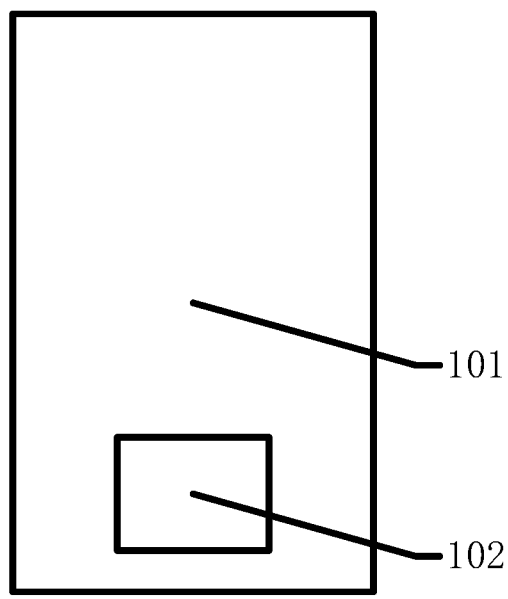
FIG. 4 is a plan view of the display device in the embodiment.

As shown in FIG. 3 and FIG. 4, the fingerprint recognition group 120 is disposed below the display panel 110 and corresponds to the fingerprint recognition region 102. When fingers perform a touch control operation on the touch control layer 130, light reflected by the fingers passes through the display panel 110 through the first through-hole 11501 and the second through-hole 11502 to enter the fingerprint recognition group 120. Since the first through-hole 11501 and the second through-hole 11502 play a role of collimator, in the present embodiment, the fingerprint recognition group 120 comprises an optical lens 121 and a light sensor 122, which removes a collimator component in the prior art and greatly reduces a thickness of the display device 10.

In order not to damage display images of the display panel 110, the first through-hole 11501 and the second through-hole 11502 are defined in the light-shielding region 1012, and the thin film transistor structure layer 114 comprises the active layer 1141, the first gate layer 1143, the second gate layer 1145, and the source/drain 1147. In order not to damage a structure of the thin film transistor structure layer 114, diameters of the first through-hole 11501 and the second through-hole 11502 in the present embodiment are less than a size of the light-shielding region 1012, that is, ⅓ of an interval between the adjacent pixel regions 1011.

The above are only preferred embodiments of the present disclosure and are not intended to limit the present disclosure. Any modification, equivalent replacement and improvement made within spirit and principle of the present disclosure shall be included in a protection scope of the present disclosure.

What is claimed is:

1. A display device, comprising a display region and a fingerprint recognition region disposed in the display region, and further comprising:
    a display panel comprising a light-shielding structure and a plurality of light-transmitting holes defined on the light-shielding structure in the fingerprint recognition region; and
    a fingerprint recognition group disposed on a side of the display panel and corresponding to the fingerprint recognition region,
    wherein the light-shielding structure comprises a pixel definition layer disposed on an entirety of the display region and a plurality of retaining wall structures disposed on the pixel definition layer;
    the plurality of light-transmitting holes comprise a plurality of first through-holes, each of the first through-holes penetrates through the pixel definition layer; and
    a part of the retaining wall structures disposed in the fingerprint recognition region are provided with holes each penetrating therethrough and each corresponding to one of the first through-holes.

2. The display device as claimed in claim 1, wherein the light-shielding structure further comprises a planarization layer disposed on an entirety of the display region, the pixel definition layer is disposed on a side of the planarization layer and covers the planarization layer, each of the through-holes runs through the planarization layer and the pixel definition layer, and the planarization layer and the pixel definition layer are made of light-shielding materials.

3. The display device as claimed in claim 2, wherein the planarization layer and the pixel definition layer are made of black polyimide materials.

4. The display device as claimed in claim 2, wherein the light-shielding structure further comprises a light-shielding layer disposed on the entirety of the display region, the plurality of light-transmitting holes further comprise a plurality of second through-holes each penetrating through the light-shielding layer and corresponding to one of the first through-hole, and the light-shielding layer is made of a black polyimide material or a metal material.

5. The display device as claimed in claim 4, wherein the display panel further comprises:
    a substrate;
    a blocking layer disposed on the substrate;
    a buffer layer disposed on the blocking layer, wherein the light-shielding layer is disposed between the blocking layer and the buffer layer;
    a thin film transistor structure layer disposed on the buffer layer, wherein the planarization layer is disposed on the thin film transistor structure;
    an anode layer disposed on the planarization layer and partially penetrating through the planarization layer to be connected to the thin film transistor structure layer, wherein the pixel definition layer further covers the anode layer, and a pixel opening is defined on the pixel definition layer corresponding to the anode layer;
    a light-emitting layer disposed in the pixel opening, wherein a retaining wall opening is defined on the retaining wall structures corresponding to the pixel opening;
    a cathode layer disposed on the light-emitting layer and disposed in the retaining wall opening; and
    a package layer disposed on the pixel definition layer.

6. The display device as claimed in claim 5, wherein the display device further comprises a touch control layer disposed on a side of the package layer away from the pixel definition layer.

7. The display device as claimed in claim 1, wherein the fingerprint recognition group comprises:
- an optical lens disposed corresponding to the fingerprint recognition region and on the side of the display panel; and
- a light sensor disposed on a side of the optical lens away from the display panel.

8. The display device as claimed in claim 4, wherein a projection of each of the first through-holes and the second through-holes on a substrate of the display panel are at least one of a circle, a rhombus, or a rectangle.

9. The display device as claimed in claim 5, wherein a projection of each of the first through-holes on the substrate falls into a projection of one of the second through-holes on the substrate.

10. The display device as claimed in claim 1, wherein a projection of each of the first through-holes on the substrate completely overlaps a projection of one of the second through-holes on the substrate.

11. The display device as claimed in claim 1, wherein the display region comprises a plurality of pixel regions and a light-shielding region surrounding the pixel regions, and the first through-holes are disposed in the light-shielding region.

12. The display device as claimed in claim 10, wherein a size of each of the first through-holes is less than a size of the light-shielding region.

\* \* \* \* \*